(12) United States Patent
Yamada et al.

(10) Patent No.: US 6,174,841 B1
(45) Date of Patent: Jan. 16, 2001

(54) HEAT-REDUCING SILICONE GREASE COMPOSITION AND SEMICONDUCTOR DEVICE USING THE SAME

(75) Inventors: Kunihiro Yamada; Kenichi Isobe; Takayuki Takahashi, all of Gunma-ken (JP)

(73) Assignee: Shin-Etsu Chemical Co., Ltd., Tokyo (JP)

( * ) Notice: Under 35 U.S.C. 154(b), the term of this patent shall be extended for 0 days.

(21) Appl. No.: 09/409,902

(22) Filed: Oct. 1, 1999

(51) Int. Cl.$^7$ .......................... C10M 113/08; H01L 23/34
(52) U.S. Cl. .......................... 508/172; 508/155; 508/161; 508/208; 257/713
(58) Field of Search .................................. 508/172, 155, 508/161, 208; 257/713

(56) References Cited

U.S. PATENT DOCUMENTS

| | | | |
|---|---|---|---|
| 3,671,429 | * | 6/1972 | Wright . |
| 4,265,775 | * | 5/1981 | Aakalu et al. . |
| 5,100,568 | * | 3/1992 | Takahashi et al. . |
| 5,221,339 | * | 6/1993 | Takahashi et al. . |
| 5,227,081 | * | 7/1993 | Sawa et al. . |
| 5,981,641 | * | 11/1999 | Takahaski et al. . |
| 6,015,777 | * | 1/2000 | Lostritto, Jr. et al. . |

* cited by examiner

*Primary Examiner*—Jerry D. Johnson
(74) *Attorney, Agent, or Firm*—Millen White Zelano & Branigan

(57) ABSTRACT

A heat-reducing silicone grease composition comprising a mixture of (A) 50–95 weight % of aluminum nitride powder having an average particle size of 0.5–10 μm and containing no particles 100 μm or greater in size, (B) 5–50 weight % of liquid silicone having a viscosity of 50–500,000 cs at 25° C. and (C) 0–30 weight % of at least one powder selected from the group consisting of zinc oxide, alumina, boron nitride and silicon carbide powders; and a semiconductor device to which the foregoing silicone grease composition is applied.

17 Claims, 1 Drawing Sheet

HEAT-REDUCING SILICONE GREASE COMPOSITION AND SEMICONDUCTOR DEVICE USING THE SAME

FIELD OF THE INVENTION

The present invention relates to a heat-reducing silicone grease composition and, more particularly, to a thermally conductive grease composition well suited for heat reduction of electronic parts. Further, the invention relates to a semiconductor device that is provided with a heat-reducing silicone grease composition to enable efficient removal of the heat generated from electronic parts and prevent the semiconductor performance from deteriorating or being damaged by a temperature rise due to heat generation.

BACKGROUND OF THE INVENTION

Packaged IC units as electronic parts packaged on a printed wiring substrate, including a central processing unit (CPU), generate heat during the operation to raise the temperature, and thereby their performance is lowered or ruined at times. Therefore, it is necessary for the packaged IC units to be equipped with a heat dissipating means. Hitherto, the method of providing a heat dissipater on the surface of a packaged IC unit by pressure welding to utilize convection for improving the heat-dissipating efficiency has been proposed, and put to practical use.

However, such a method cannot avoid leaving gaps in the heat dissipater-packaged IC unit interface, so that the packaged IC unit and the heat dissipater have a reduced contact area in their pressure-welded plane. Accordingly, the heat dissipation efficiency cannot be achieved as it was designed. In order to close up those gaps, it has been carried out to lay a heat-reducing sheet, heat-reducing grease or the like between the packaged IC unit and the heat dissipater (as disclosed, e.g., in Japanese Tokkai Sho 56-28264 (U.S. Pat. No. 4,265,775) and Japanese Tokkai Sho 61-157587, wherein the term "Tokkai" means a "unexamined published patent application). In the case of a heat-reducing sheet, the material for heat reduction is molded in advance into a sheet having a thickness adequate for securing strength. Because of its thickness, the sheet increases in thermal resistance to fail in achieving sufficient heat reduction efficiency.

On the other hand, the heat-reducing grease has the advantage of making it possible to close up the gaps between the packaged IC unit and the heat dissipater by applying pressure thereto even when they have rough surfaces. Hitherto, the heat-reducing grease containing zinc oxide powder, boron nitride (having a hexagonal crystal structure: h-BN) powder or the like as a main component has been proposed. However, such a mineral itself has low thermal conductivity. For instance, the thermal conductivity of zinc oxide is about 20 W/mk and that of boron nitride (h-BN) is about 60 W/mk. Therefore, the, foregoing grease is unsatisfactory in heat-reducing properties.

In addition, the grease containing aluminum nitride having high thermal conductivity of about 320 W/mk as a main component has so far been proposed (e.g., in Japanese Tokkai Sho 52-125506). While the aluminum nitride can ensure satisfactory heat-reducing properties in the grease, it has also the disadvantage of hardness. More specifically, when the grease is applied to a packaged IC unit, such as CPU, having a bare surface, cases are often met with that the aluminum nitride in the grease damages the silicon surface of the packaged IC unit because of its high Mohs's hardness of 7–9 to mar the characteristics of the packaged IC unit.

SUMMARY OF THE INVENTION

As a result of our intensive study to develop highly efficient heat-reducing grease which involves no risk of damaging the silicon surface but has high thermal conductivity, it has been found that very good results can be obtained when the aluminum nitride powder used in grease has its average particle size in a particular range and contains no particles 100 μm or greater in size.

Therefore, a first object of the invention is to provide a high-efficiency silicone grease composition for heat reduction, which has high thermal conductivity and does not damage the silicon surface of a packaged IC unit, such as CPU.

A second object of the invention is to provide a semiconductor device wherein the heat-reducing silicone grease according to the present invention is laid between a packaged IC unit and a heat dissipater.

One of the aforementioned objects is attained with a heat-reducing silicone grease composition comprising a mixture of (A) 50–95 weight % of aluminum nitride powder having an average particle size of 0.5–10 μm and containing no particles 100 μm or greater in size, (B) 5–50 weight % of liquid silicone having a viscosity of 50–500,000 cs at 25° C. and (C) 0–30 weight % of at least one powder selected from the group consisting of zinc oxide, alumina, boron nitride and silicon carbide powders.

The other object is achieved with a semiconductor device to which the foregoing silicone grease composition is applied.

As the present heat-reducing silicone grease composition is free of aluminum nitride particles the sizes of which are not smaller than 100 μm, there is no fear of damaging the packaged IC unit surface. Further, the present grease composition has excellent extensibility and high thermal conductivity, so that the present semiconductor device can acquire very good heat-dissipating properties. Therefore, the reliability of electronic parts as a whole can be improved by incorporating semiconductor devices according to the invention in the electronic parts.

DETAILED DESCRIPTION OF THE INVENTION

Figure 1:
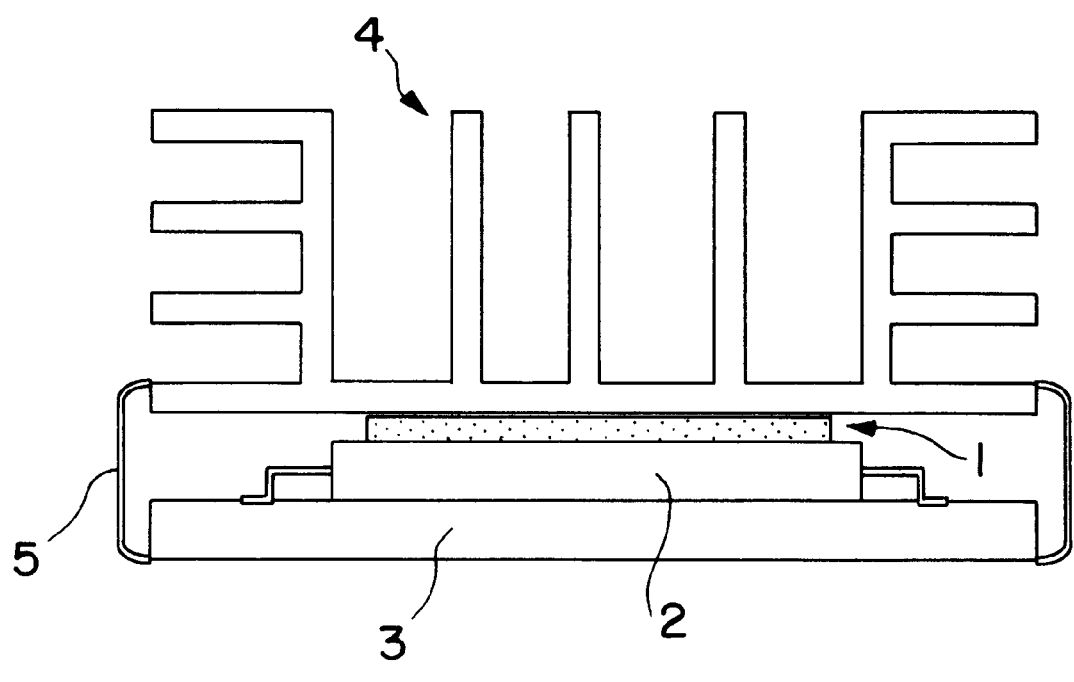
FIG. 1 is a longitudinal section of one example of a semiconductor device according to the present invention. Therein, the FIG. 1 denotes a heat-reducing silicone grease composition, the numeral 2 denotes a packaged IC unit, such as, a central processing unit (CPU), the numeral 3 denotes a printed wiring substrate, the numeral 4 denotes a heat dissipater, and the numeral 5 denotes a clamp.

The aluminum nitride powder as Component (A) of the present composition is a nitride constituted of Group III and Group V elements, which generally has a hexagonal or wurtzite-type crystal structure and a white or grayish white appearance. The particle shape of the powder is amorphous or spherical depending on the preparation method adopted. Although aluminum nitride powders can be used in the invention as far as they each have the average particle size in the range of 0.5 to 10 μm, it is favorable for preparation of homogeneous grease composition that the average particle size of the powder be in the range of 1 to 5 μm, particularly 2 to 4 μm. These values of the average particle size are those determined with a laser diffraction particle size measuring apparatus, Granulometer 850 (made by Cilas Alcatel Inc.).

Further, in order not to damage the silicon surface of a packaged IC unit, the present aluminum nitride powder is required to be free of particles the sizes of which are not smaller than 100 μm. For the present aluminum nitride powder, it is desirable to be free of particles the sizes of which are not smaller than 75 μm, particularly 50 μm. This is because, when the dissipater is brought into contact with a packaged IC unit, the coarse particles in the grease tend to damage the silicon surface of packaged IC unit. Such coarse particles can be removed from the aluminum nitride powder by carrying out a screening operation or using an airflow classifier. The particle-size measurement in the invention is made with a laser diffraction particle size measuring apparatus, Granulometer 850 (made by Cilas Alcatel Inc.).

It is desirable for the present aluminum nitride powder to have a specific surface area of 0.1–100 m$^2$/g. For the preparation of a homogeneous grease composition, it is desirable to use the aluminum nitride powder having its specific surface area in the range of 1–10 m$^2$/g, particularly 2–5 m$^2$/g. These values of the specific surface area are those determined according to JIS K1150.

When the proportion of the present aluminum nitride powder in the composition is smaller than 50 weight %, the desired thermal conductivity cannot be achieved; while, when the proportion is greater than 95 weight %, the composition obtained cannot assume a grease condition and has poor extensibility. Therefore, the suitable proportion of the present aluminum nitride powder is from 50 to 95 weight %, preferably from 60 to 90 weight %.

The aluminum nitride powders usable as raw material can be prepared, e.g., by a direct nitriding method wherein a metallic aluminum powder is reacted directly with nitrogen or ammonia, an alumina reducing method wherein a mixed powder of alumina and carbon is heated in an atmosphere of nitrogen or ammonia to effect the reduction and the nitriding at the same time, a method of reacting an aluminum vapor directly with nitrogen, or a method of thermally decomposing $AlCl_3 \cdot NH_3$.

Although aluminum nitride powders have characteristics depending on the preparation methods thereof with respect to, e.g., the chemical composition (impurities), the particle shape and the particle size distribution, the aluminum nitride powder used in the invention may be prepared by any of the preparation methods as mentioned above, and it may be a mixture of powders prepared by different methods. In addition, if desired, these aluminum nitride powders may be rendered hydrophobic by undergoing treatment with organosilanes, organosilazanes, organopolysiloxanes or fluorine-containing organic compounds.

In general, aluminum nitride is very hard, and the Mohs' hardness thereof is in the range of 7–9. Any aluminum nitride can be used in the invention so long as the Mohs' hardness thereof is in the foregoing range. In particular, the use of aluminum nitride powders having Mohs' hardness of 8–9 is advantageous to the invention.

The thermal conductivity of aluminum nitride is 320 W/mk in theory, but the actually measured value thereof is lower than the theoretical value, specifically 250 W/mK or below, because the aluminum nitride powder prepared in practice is more or less contaminated with impurities and contains voids and bubbles. For the aluminum nitride powder used in the invention, it is desirable to have a thermal conductivity of at least 60 W/mk, particularly at least 100 W/mk, at room temperature. When the aluminum nitride powder used has thermal conductivity lower than 60 W/mk, it cannot provide the resulting grease with high thermal conductivity as aimed at by the invention.

Examples of aluminum nitride usable in the invention include US, UF and UM, trade names, produced by Toyo Aluminum Co., Ltd.; XUS-55548, trade name, produced by Dow Chemical Co., Ltd.; H-grade and F-grade, trade names, produced by K.K. Tokuyama; FA and ES-10, trade names, produced by Nippon Light Metal Co., Ltd.; and A-100WR, A-100 and AG-SD, trade names, produced by Advanced Refractory Technologies Inc.

The liquid silicones usable as a base oil in the invention can be selected properly from known silicones which are in a liquid state at room temperature, such as organopolysiloxanes, organopolysilalkylenes, organopolysilanes and copolymers thereof. In particular, organopolysiloxanes, especially those represented by formula $R_aSiO_{(4-a)/2}$, are preferred as the liquid silicone used in the invention from the viewpoint of ensuring heat resistance, stability and electric insulation for the resulting composition. In the foregoing formula, R represents a substituted or unsubstituted univalent hydrocarbon group containing 1 to 30 carbon atoms, an amino group-containing organic group, a polyether-containing organic group or an epoxy group-containing organic group.

The suffix "a" in the foregoing formula is a number ranging from 1.8 to 2.2, preferably 1.9 to 2.1.

The organopolysiloxanes used in the invention are required to have their viscosity in the range of 50 to 500,000 cs at 25° C. This is because, when the organopolysiloxanes having viscosity lower than 50 cs at 25° C. are contained in a grease composition, the composition shows a tendency to oil bleeding; while the grease composition containing organopolysiloxanes having viscosity higher than 500,000 cs at 25° C. is poor in extensibility. In particular, it is advantageous to use organopolysiloxanes having their viscosity in the range of 100 to 100,000 cs at 25° C. The suitable proportion of these organopolysiloxanes in the present grease composition is from 5 to 50 weight %, preferably from 7 to 30 weight %. This is because, when the organopolysiloxanes are used in a proportion lower than 5 weight %, the composition obtained cannot take a state of grease and has poor extensibility; while when they are used in a proportion higher than 50 weight % the composition obtained has insufficient thermal conductivity. Additionally, the viscosity measurement in the invention was made according to JIS K2283.

Examples of these organopolysiloxanes include dimethylpolysiloxane, diethylpolysiloxane, methylphenylpolysiloxane, dimethylsiloxane-diphenylsiloxane copolymers, and alkyl-modified methylpolysiloxanes. In particular, the homopolymers prepared from dimethylsiloxane, an alkylmethylsiloxane, methylphenylsiloxane or diphenylsiloxane, and copolymers prepared from two or more of these siloxanes, the molecular chain ends of which are blocked with trimethylsilyl or dimethylhydrosilyl groups, are preferred over the others.

More specifically, the organopolysiloxanes represented by the following formula (I) are used to advantage:

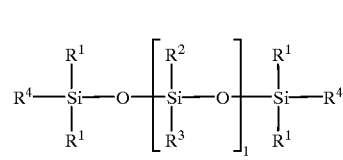

(I)

In formula (I), each of $R^1$ groups represents a group selected from unsubstituted or substituted univalent hydrocarbon groups containing 1 to 30 carbon atoms, including alkyl groups (e.g., methyl, ethyl, propyl, butyl, amyl and octyl groups), alkenyl groups (e.g., vinyl and allyl groups), aryl groups (e.g., phenyl and tolyl groups) and groups formed by substituting halogen atom(s), cyano group(s) or/and hydroxyl group(s) for a part or all of the hydrogen atoms attached to carbon atoms present in the above-recited groups (e.g., chloromethyl, 3,3,3-trifluoropropyl, cyanopropyl, phenol, hindered phenol groups).

$R^2$ groups represent univalent organic groups, which may be the same as or different from one another. And $R^3$ groups also represent univalent organic groups, which may be the same as or different from one another. More specifically, each of these groups is a group selected from the univalent hydrocarbon groups recited above as examples of $R^1$, amino group-containing organic groups, polyether group-containing organic groups, or epoxy group-containing organic groups. Each of the $R^4$ groups is a hydrogen atom, a group selected from the univalent hydrocarbon groups recited as examples of $R^1$ and the univalent organic groups recited as examples of $R^2$ and $R^3$, or a hydroxyl group. The suffix "l" in formula (I) is a positive integer to enable the organopolysiloxane to have a viscosity of from 50 to 500,000 cs at 25° C.

Preferably, the organopolysiloxanes used in the invention are organopolysiloxanes having the molecular chain ends blocked by trimethylsilyl groups. From viewpoints of preparing such organopolysiloxanes with ease and ensuring high heat resistance and electric insulation for them, the groups contained therein as $R^1$, $R^2$ and $R^3$ groups are alkyl groups such as methyl and ethyl groups, aryl groups such as phenyl and tolyl groups, or/and groups formed by substituting hydroxyl group(s) for a part of hydrogen atoms attached to the carbon atoms of alkyl or aryl groups. Of these groups, methyl group, phenyl group and alkyl groups containing 6 to 14 carbon atoms are preferred in particular.

Those organopolysiloxane oils can be produced using conventional methods. For instance, a dimethylpolysiloxane oil can be produced by a method comprising steps of subjecting a low molecular cyclosiloxane, such as octamethylcyclotetrasiloxane or decamethylcyclopentasiloxane, in the presence of an acidic catalyst (e.g., sulfuric acid, chlorosulfonic acid, nitric acid, phosphoric acid, activated clay, acid clay, trifluoroacetic acid) or an alkaline catalyst (e.g., potassium hydroxide, sodium hydroxide, rubidium hydroxide, cesium hydroxide, potassium oxide, potassium acettate, calcium silanolate) and polymerizing the reaction product.

For the production of dimethylpolysiloxane having the desired viscosity, it is required to control the polymerization degree in the foregoing polymerization step. The control of polymerization degree can be effected by adding a low molecular siloxane having an end-blocking group, such as hexamethyldisiloxane, octamethyltrisiloxane or decamethyltetrasiloxane, at an appropriate point in polymerization.

As to the production of organopolysiloxanes containing, functional groups via carbon atom(s), for instance, the amino group-containing organopolysiloxane can be produced by the dealcoholizing condensation reaction between an organopolysiloxane containing at least one silanol group and an amino group-containing alkoxysilane, and the epoxy or polyether group-containing organopolysiloxane can be produced by the addition reaction of a compound having both an epoxy or polyether group and an unsaturated group, such as vinyl group, with an organohydrogenpolysiloxane having at least one silicon-attached hydrogen atom in the presence of a platinum catalyst.

The surface of at least one inorganic powder used as Component (C), which is selected from the group consisting of zinc oxide, alumina, boron nitride and silicon carbide powders, may be rendered hydrophobic by treatment with an organosilane, organosilazane, organopolysiloxane or organic fluorine-containing compound, if desired. When the inorganic powder as Component (C) is used in a proportion greater than 30 weight %, the resulting composition comes to have poor extensibility. Therefore, the suitable proportion of inorganic powder used as Component (C) is 0–30 weight %, preferably 0–20 weight %.

The zinc oxide powder used in the invention is a white powder having a hexagonal or Wurtzite crystal structure, which is generally called Zinc White. Such a zinc oxide powder can be produced using known methods. One of the known methods is an indirect method wherein the zinc vapor produced generally by heating metallic zinc to 1,000° C. is oxidized with hot air. And another of them is a direct method wherein the zinc oxide obtained by roasting zinc ore is reduced with coal and the zinc vapor produced thereby is oxidized with hot air, or wherein the slag obtained by leaching zinc ore with sulfuric acid is mixed with coke and then heated in an electric furnace to vaporize the zinc, and the zinc vapor produced thereby is oxidized with hot air.

In any of the foregoing methods, the zinc oxide produced is cooled by passing through an air condenser equipped with a blower, and fractionated according to particle size.

As still another method of producing zinc oxide powder, there is known a wet method wherein the zinc hydroxycarbonate precipitated by addition of an alkali carbonate solution to a solution of zinc salt is roasted.

The zinc oxide powders produced according to those methods are defined in Japanese Industrial Standards, JIS K1410 and JIS K5102, and American Standards, ASTM-D79.

Any of the zinc oxide powders produced by the foregoing methods can be used alone in the invention. Also, the powders produced by different methods may be used as a mixture.

In general the zinc oxide powder is used not only as a vulcanization accelerator for rubber but also in the fields of coating colors, ceramics, enameled ware, glass, ferrite, cosmetics and medicines. Further, it is also known to use a zinc oxide powder as a thermal conductivity providing filler in thermally conductive grease [Japanese Tokkai Sho 51-55870, Sho 54-116055, Sho 55-45770, Sho 56-28264, Sho 61-157587, Hei 2-212556 (U.S. Pat. No. 5,221,339), Hei 3-162493 (U.S. Pat. No. 5,100,568) and Hei 4-202496].

The average particle size of a zinc oxide powder usable in the invention is in a wide range of 0.2 to 5 µm. In view of the dispersibility in the liquid silicone as base oil and the relation to the aluminum nitride powder used in combination, however, it is desirable to use a zinc oxide powder having its average particle size in the range of 0.3 to 4 µm, particularly 0.3 to 3 µm. As to the hardness, on the other hand, it is desirable for the zinc oxide powder used to have Mohs' hardness of from 4 to 5.

The alumina powder usable as a thermal conductivity providing filler in the invention is a powder of aluminum oxide represented by chemical formula $Al_2O_3$, with examples including aluminum oxide powders generally referred to as "alumina", "α-alumina", "single crystal corundum fines" and "spherical alumina" respectively depending on their production methods.

In general the industrial manufacturing of alumina is carried out using the so-called Bayer method, wherein bauxite as a raw material is treated with hot sodium hydroxide. In this method, the crystals of aluminum hydroxide, Al(OH)$_3$, are once formed, and then burned at a high temperature by means of, e.g., a rotary kiln to be converted into alumina. Since alumina has excellent thermal, mechanical and physical-and-chemical characteristics, it has various uses, e.g., as a refractory material, abrasives, a raw material for porcelain, a white filling pigment and catalyst.

The generally used alumina powder is an α-alumina powder having a crystal structure belonging to a hexagonal system or hexagonal rhombohedral lattice, and it is a white powder in appearance. The α-alumina powder has an apparent average particle size of the order of 20–80 μm, and each particle is constituted of primary crystals of alumina having a size of the order of 0.5–20 μm. And it is possible to produce the α-alumina powder in various grades depending on the intended use thereof. In a case where the α-alumina powder is incorporated in a silicone grease, the shape and size thereof have delicate effects on the characteristics of the resulting grease, including the homogeneity and the consistency.

The apparent average particle size of alumina powder usable in the invention is in the wide range of 20–80 μm. From the viewpoint of dispersibility in liquid silicone, however, it is desirable that the alumina powder used in the invention have its apparent average particle size in the range of 30 to 50 μm, particularly 30 to 40 μm. As to the hardness of powder, although the alumina is generally very hard and has Mohs' hardness of from 8 to 9, it is permissible in the invention to use a powder having such a range of Mohs' hardness.

The boron nitride powder usable in the invention can be produced by heating boric acid or a borate together with a nitrogen compound, such as a nitrogen-containing organic compound or ammonia. The product obtained therein is a boron nitride powder having a hexagonal crystal structure similar to that of graphite, or a hexagonal network laminate. The boron nitride having a crystal structure of hexagonal system has excellent characteristics such that it can retain high lubricity even in a high temperature range, has high thermal conductivity as well as high electrical insulating capacity, and further is chemically stable and hardly wetted with fused metal or glass. Therefore, the boron nitride is used as an insulating filler having high thermal conductivity, a solid lubricant, a filler for resin modification and so on.

The hexagonal boron nitride powder as mentioned above is white in appearance, and has an average particle size of 1 to 10 μm.

In the invention, any boron nitride powder can be used so far as the average particle size thereof is in a wide range of 1 to 10 μm. However, from the viewpoints of the dispersibility in liquid silicone and the prevention of oil separation, it is desirable that the average particle size of the boron nitride powder used in the invention be in the range of 1 to 5 μm.

As to the hardness, the boron nitride powder having a crystal structure of hexagonal system is generally soft. It is advantageous to the invention to use a boron nitride powder having Mohs' hardness of from 1 to 3, particularly around 2.

Silicon carbide powder is generally prepared by pulverizing high-purity α-SiC ingot produced from silica and coke as main row materials by means of an electric resistance furnace (Acheson furnace), and subjecting the pulverized matter to decarburizing, iron-removing and sieving steps in succession. This production method can provide silicon carbide powders various in particle size distribution depending on the intended uses. Further, ultra fine silicon carbide powder can also be prepared as follows: After producing a silicon carbide powder having a moderate size distribution by the foregoing method, the powder is thoroughly ground into fine particles of sub-micron order in size, sieved, and then purified by a chemical treatment.

The particle size and the particle size distribution of silicon carbide are determined using the methods defined in JIS R6001, JIS R6002 and JIS R6124. The average particle size of silicon carbide powder used in the invention, though may be in the wide range of 0.4–10 μm, is desirably in the range of 0.4 to 5 μm from the viewpoints of achieving good dispersibility in liquid silicone and preventing the oil separation. The silicon carbide powder is bluish black in appearance, has a crystal structure of trigonal prism, and is generally hard. As to the hardness, the silicon carbide powder having its Mohs' hardness in the range of 8–9 can be used in the invention.

In preparing a heat-reducing silicone grease composition according to the invention, the aforementioned Components (A) to (C) are mixed together by means of a mixing machine, e.g., TRIMIX, TWINMIX or PLANETARY MIXER (trade names, made by INOUE MFG., INC.), ULTRA MIXER (trade name, made by MIZUHO INDUSTRIAL CO., LTD.) or HIVISDISPERMIX (trade name, made by TOKUSHU KIKA KOGYO CO., LTD.). Therein, the mixing system may be heated to a temperature of 50–150° C., if desired. For rendering the thus prepared mixture more homogeneous, it is desirable to perform a kneading operation under high shear stress. Examples of a kneader usable for such an operation include a three-rod roll kneader, a colloid mill and a sand grinder. Of these kneaders, a three-rod roll kneader is used to advantage.

The present heat-reducing grease composition prepared in the manner as mentioned above can be used in the same ways for the same purposes as conventional thermally conductive grease compositions. On the other hand, the present semiconductor device is constituted of an IC unit packaged on a printed wiring substrate, a heat dissipater provided on the packaged IC unit surface by pressure welding and the present heat-reducing silicone grease composition that comprises Components (A) to (C) and is inserted between the packaged IC unit and the heat dissipater. In a particular case where the packed IC unit has a bare silicon surface, the present semiconductor device can achieve a remarkable improvement in performance over conventional ones.

Accordingly, the application of the present embodiments to CPU for host computer use, personal computer use or word processor use, which suffers a temperature rise to a level of 170° C., enables the generated heat to be steadily diffused and dissipated and thereby can prevent the CPU from declining in performance or being damaged or broken by accumulated heat.

Now, the invention will be illustrated in greater detail by reference to the following Examples, but these examples should not be construed as limiting the scope of the invention.

The entire disclosure of all applications, patents and publications, cited above and below, and of corresponding Japanese application No. Hei 10-281196, filed, Oct. 2, 1998, is hereby incorporated by reference.

Additionally, the examination of heat-reducing silicone grease compositions according to the invention for their damage prevention effects upon a packed IC unit is carried out in the following manner:

In assembling the semiconductor device as shown in FIG. 1, a silicone grease composition (in the proportion of 0.2 g on a plane measuring 2 cm×2 cm in size) is laid between the surface of a packaged IC unit 2 and a heat dissipater 4 (heat sink). The heat sink as a heat dissipater is made of aluminum, and has a structure provided with fins for the purpose of increasing the surface area to improve the heat dissipation efficiency. Further, the heat dissipater 4 and the printed wiring substrate 3 are pressed to each other by being fastened and fixed with clamps 5.

The start-stop cycle of CPU is repeated 5,000 times, and then the grease is removed from the CPU surface. This operation is referred to as "cycle test" hereinafter. The resulting CPU surface is observed under an optical microscope, OPTIPHOTO (trade name, made by Nikon Corporation).

In addition, the thermal conductivity of each grease prepared is measured at 25° C. with a quick thermal conductivity meter, QTM-500 (trade name, made by KYOTO ELECTRONICS MFG. CO., LTD.), and the consistency thereof was measured at 25° C. according to the testing method defined in JIS K-2220.

EXAMPLES 1 TO 5

Silicone grease composition samples according to the invention (Examples 1–5) were each prepared by weighing Components (A) to (C) in their respective amounts set forth in Table 1, mixing them for 20 minutes at room temperature by means of a planetary mixer having a volume of 5 liter, and then subjecting the resulting mixture to a kneading operation with a three-rod roll kneader three times. Each silicone grease thus prepared was examined for consistency and thermal conductivity, and further the surface condition of the CPU after undergoing the cycle test was observed. The results obtained are shown in Table 1. Additionally, the ingredients A-1, A-2, B-1, B-2, C-1 and C-2 set forth in Table 1 are as follows:

A-1; Aluminum nitride powder (crystal shape: amorphous, average particle size: 3.2 μm, specific surface area: 3.0 m²/g, particle size distribution: no particles having sizes of 50 μm and above)

A-2; Aluminum nitride powder (crystal shape: amorphous, average particle size: 3.1 μm, specific surface area: 2.9 m²/g, particle size distribution: no particles having sizes of 40 μm and above)

B-1;

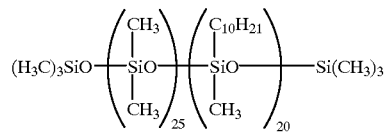

viscosity: 390 cs (25° C.)

B-2;

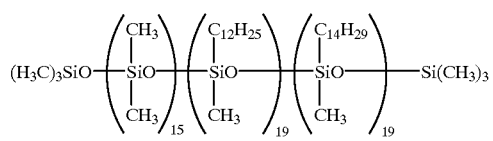

viscosity: 550 cs (25° C.)

C-1; Zinc oxide powder (average particle size: 2.0 μm)

C-2; Alumina powder (average particle size: 15 μm)

TABLE 1

| | Example | | | | |
|---|---|---|---|---|---|
| Ingredient | 1 | 2 | 3 | 4 | 5 |
| Amount mixed | | | | | |
| Component A) | | | | | |
| A-1 | 750 | 600 | 850 | 750 | 0 |
| A-2 | 0 | 0 | 0 | 0 | 750 |
| Component B) | | | | | |
| B-1 | 100 | 300 | 150 | 0 | 0 |
| B-2 | 0 | 0 | 0 | 150 | 150 |
| Component C) | | | | | |
| C-1 | 150 | 100 | 0 | 0 | 0 |
| C-2 | 0 | 0 | 0 | 100 | 100 |
| Consistency | 270 | 340 | 295 | 280 | 290 |
| Thermal conductivity (W/mK) | 3.5 | 2.6 | 2.9 | 2.9 | 2.9 |
| To surface condition of CPU | no damage | no damage | no damage | no damage | no damage |

Comparative Example 1 to 3

Other silicone grease composition samples for comparison (Comparative Examples 1–3) were each prepared by weighing Components (A) to (C) in their respective amounts set forth in Table 2, mixing them for 20 minutes at room temperature by means of a planetary mixer having a volume of 5 liter, and then subjecting the resulting mixture to a kneading operation with a three-rod roll kneader three times. In the same ways as adopted in the Examples, each of the samples prepared was examined for consistency and thermal conductivity, and further the surface condition of the CPU was observed after the cycle test. The results obtained are shown in Table 2. Additionally, the ingredients A-1, B-1, B-2, C-1 and C-2 set forth in Table 2 are the same ones as in Table 1 respectively, and the ingredient A-3 is an aluminum nitride powder being amorphous in crystal shape, having an average particle size of 3.6 μm and a specific surface area of 3.0 m²/g and containing 5 volume % of coarse particles having sizes of 100 μm and above.

TABLE 2

| | Comparative Example | | |
|---|---|---|---|
| Ingredient | 1 | 2 | 3 |
| Amount mixed | | | |
| Component A) | | | |
| A-1 | 760 | 450 | 0 |
| A-3 | 0 | 0 | 600 |
| Component B) | | | |
| B-1 | 40 | 350 | 200 |
| B-2 | 0 | 0 | 0 |
| Component C) | | | |
| C-1 | 200 | 200 | 200 |
| C-2 | 0 | 0 | 0 |
| Consistency | no-grease | 395 | 290 |
| Thermal conductivity (W/mK) | — | 1.0 | 2.8 |
| To surface condition of CPU | — | no damage | damage |

The data shown in Tables 1 and 2 demonstrate the advantages of the present invention.

What is claimed is:

1. A heat-reducing silicone grease composition comprising a mixture of (A) 50–95 weight % of aluminum nitride powder having an average particle size of 0.5–10 μm and containing no particles 100 μm or greater in size, (B) 5–50 weight % of liquid silicone having a viscosity of 50–500,000 cs at 25° C. and (C) 0–30 weight % of at least one powder selected from the group consisting of zinc oxide, alumina, boron nitride and silicon carbide powders.

2. A heat-reducing silicone grease composition according to claim 1, wherein said liquid silicone is organopolysiloxanes represented by formula $R_aSiO_{(4-a)/2}$ wherein R represents a substituted or unsubstituted univalent hydrocarbon group containing 1 to 30 carbon atoms, an amino group-containing organic group, a polyether-containing organic group or an epoxy group-containing organic group and a is a number ranging from 1.8 to 2.2.

3. A heat-reducing silicone grease composition according to claim 1, wherein said aluminum nitride powder contains no particles 75 μm or greater in size.

4. A heat-reducing silicone grease composition according to claim 3, wherein said aluminum nitride powder contains no particles 50 μm or greater in size.

5. A heat-reducing silicone grease composition according to claim 1, wherein the average particle size of said aluminum nitride powder is from 1 to 5 μm.

6. A heat-reducing silicone grease composition according to claim 1, wherein said aluminum nitride powder has a specific surface area of from 0.1 to 100 m²/g.

7. The heat-reducing silicone grease composition of claim 1, wherein the aluminum nitride powder has a specific surface area of 1 to 10 m²/g.

8. The heat-reducing silicone grease composition of claim 1, having 60–90% weight of the aluminum nitride powder and 7–30% weight of the liquid silicone.

9. The heat-reducing silicone grease composition of claim 1, wherein the aluminum nitride powder has a Mohs' hardness of 8–9.

10. The heat-reducing silicone grease composition of claim 1, wherein the aluminum nitride powder has a thermal conductivity of at least 60 W/mk at room temperature.

11. The heat-reducing silicone grease composition of claim 1, wherein the aluminum nitride powder has a thermal conductivity of at least 100 W/mk at room temperature.

12. The heat-reducing silicone grease composition of claim 1, wherein the liquid silicone is an organopolysiloxane having a viscosity of 100 to 100,000 cs at 25° C.

13. The heat-reducing silicone grease composition of claim 1, wherein the liquid silicone is an organopolysiloxane homopolymer of dimethylsiloxane, an alkylmethylsiloxane, methylphenylsiloxane or diphenylsiloxane or copolymer of two or more of these siloxanes, the molecular chain ends of which homopolymers or copolymers are blocked with trimethylsilyl or dimethylhydrosilyl groups.

14. The heat-reducing silicone grease composition of claim 1, wherein the composition contains at least one of the zinc oxide, alumina, boron nitride or silicon carbide powders.

15. The heat-reducing silicone grease composition of claim 1, wherein the components of the composition are mixed by kneading together under high shear stress, optionally while heating at a temperature of 50 to 1500° C.

16. A semiconductor device comprising an IC unit packaged on a printed wiring substrate and a heat dissipater provided on the packaged IC unit surface, further having a heat-reducing silicone grease composition in a condition that the grease composition is inserted between the packaged IC unit surface and the heat dissipater, wherein the heat-reducing silicone composition comprises a mixture of (A) 50–95 weight % of aluminum nitride powder having an average particle size of 0.5–10 μm and containing no particles 100 μm or greater in size, (B) 5–50 weight % of liquid silicone having a viscosity of 50–500,000 cs at 25° C. and (C) 0–30 weight % of at least one powder selected from the group consisting of zinc oxide, alumina, boron nitride and silicon carbide powders.

17. The semi-conductor device of claim 16, wherein the packaged IC unit is a central processing unit.

* * * * *

UNITED STATES PATENT AND TRADEMARK OFFICE
CERTIFICATE OF CORRECTION

PATENT NO.    : 6,174,841 B1                                              Page 1 of 1
DATED         : January 16, 2001
INVENTOR(S)   : Yamada et al.

It is certified that error appears in the above-identified patent and that said Letters Patent is hereby corrected as shown below:

Column 12,
Line 22, change "1500º" to -- 150º --.

Signed and Sealed this

Thirteenth Day of May, 2003

JAMES E. ROGAN
*Director of the United States Patent and Trademark Office*